United States Patent [19]

Smith et al.

[11] Patent Number: 4,882,482

[45] Date of Patent: Nov. 21, 1989

[54] THERMALLY STABILIZED OPTICAL PREAMPLIFIER

[75] Inventors: Kevin K. Smith, West Linn, Oreg.; Bryan E. Allsop, Hertfordshire; Seb Naik, Harrow, both of England

[73] Assignee: Tektronix, Inc., Beaverton, Oreg.

[21] Appl. No.: 262,922

[22] Filed: Oct. 26, 1988

[51] Int. Cl.$^4$ .................... H01J 40/14; H03F 3/08
[52] U.S. Cl. .................... 250/214 A; 330/308; 250/214 C
[58] Field of Search ....... 250/214 A, 214 R, 214 AG, 250/214 C; 330/59, 308, 289; 455/619

[56] References Cited

U.S. PATENT DOCUMENTS

| | | | |
|---|---|---|---|
| 4,420,724 | 12/1983 | Owen | 250/214 A |
| 4,564,818 | 1/1986 | Jones | 330/308 |
| 4,808,810 | 2/1989 | VanDoorn | 250/214 A |

OTHER PUBLICATIONS

Hewlett-Packard, pp. 27–29, Jan. 1985, "An Optical Receiver for 550 to 950 nm", (Michael Fleischer-Reumann, Emmerich Muller, and Gerd Koffmane).

*Primary Examiner*—Edward P. Westin
*Attorney, Agent, or Firm*—Peter J. Meza

[57] ABSTRACT

A thermally stabilized optical preamplifier includes a first transimpedance amplifier which receives a photosignal current from a photodiode. The gate of a GaAs device is the input to the first transimpedance amplifier, and the drain is coupled to a source of constant current. Also coupled to the drain of the GaAs device is a common base stage, and the gain of the first transimpedance amplifier is set by a resistor coupled between the input of the first transimpedance amplifier and the output of the common base stage. A current setting resistor coupled to the output of the first transimpedance amplifier converts output voltage to current, which is summed with a compensating current in a second transimpedance amplifier. The compensating current consists of a variable current generator and a thermal current generator which compensate for the current produced by the absolute value and thermal characteristics of the gate to source voltage of the input GaAs device.

5 Claims, 1 Drawing Sheet

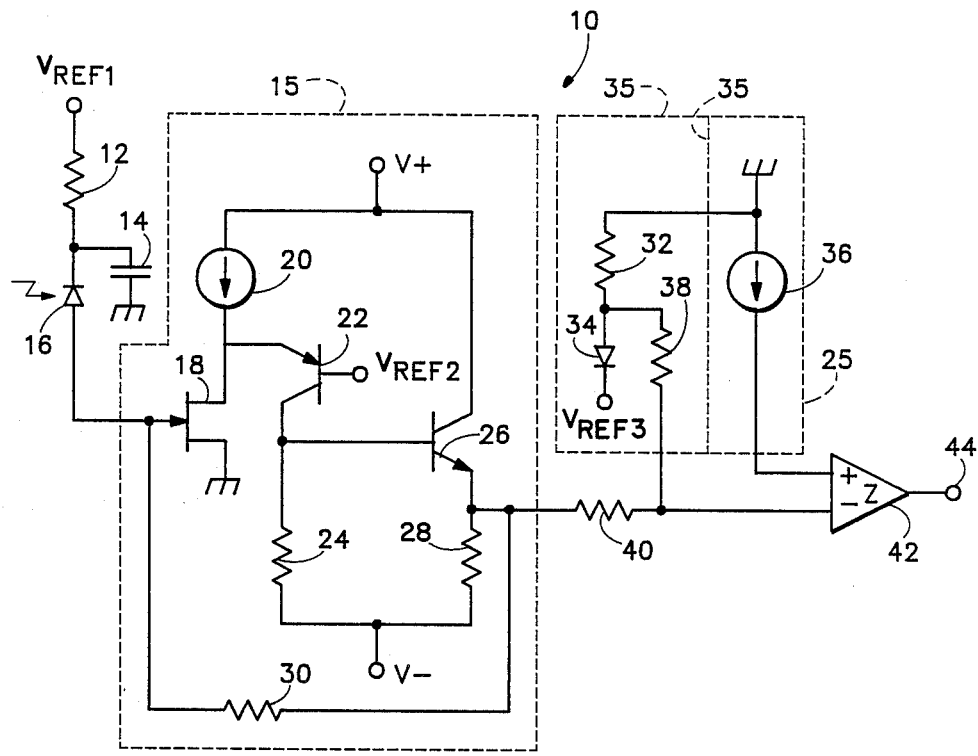

THERMALLY STABILIZED OPTICAL PREAMPLIFIER

BACKGROUND OF THE INVENTION

This invention relates to optical preamplifiers, and more specifically to optical preamplifiers which have been compensated in some manner for the thermal characteristics of an input GaAs device.

High speed circuits such as optical preamplifiers often use GaAs input devices to increase operating speed, sometimes in conjunction with silicon devices. However, the thermal behavior of these devices is complex and unrelated to the thermal behavior of silicon junctions. Therefore, what is desired is a circuit which uses a GaAs input device for increased operating speeds, yet uses a minimum of conventional silicon devices to compensate undesirable thermal coefficients produced by the GaAs device.

SUMMARY OF THE INVENTION

In a preferred embodiment of the present invention, a thermally stabilized optical preamplifier includes a first transimpedance amplifier which receives a photosignal current from a photodiode. The gate of a GaAs device is the input to the first transimpedance amplifier, and the drain is coupled to a source of constant current. Also coupled to the drain of the GaAs device is a common base stage, and the gain of the first transimpedance amplifier is set by a resistor coupled between the input of the first transimpedance amplifier and the output of the common base stage. A gain setting resistor coupled to the output of the first transimpedance amplifier converts output voltage to current, which is summed with a compensating current in a second transimpedance amplifier. The compensating current consists of a variable current generator and a thermal current generator which compensate for the current produced by the absolute value and thermal characteristics of the gate to source voltage of the input GaAs device.

BRIEF DESCRIPTION OF THE DRAWING

For a better understanding of the invention, and to show how the same may be carried into effect, reference will now be made to the accompanying drawings, in which the SOLE FIGURE is a schematic diagram of a thermally stabilized optical preamplifier in accordance with the present invention.

DESCRIPTION OF THE PREFERRED EMBODIMENT

The thermally stabilized optical preamplifier 10 shown in the SOLE FIGURE receives a photosignal input current from a photodiode 16 which is biased between a reference voltage $V_{REF1}$ and the bias voltage (gate to source voltage $V_{GS}$) of an input GaAs device 18. A high frequency filter consisting of a small value resistor 12 and compensating capacitor 14 serve to filter extremely high frequency transient signals.

A first transimpedance amplifier 15 includes GaAs input device 18, constant current source 20, PNP transistor 22, NPN transistor 26, and resistors 24, 28, and 30. The gate of GaAs input device 18 establishes a high input impedance for the first transimpedance amplifier. Bias current for the GaAs input device 18 is provided by constant current source 20. PNP transistor 22 forms a common base amplifier, with the emitter being coupled to the drain of GaAs input device 18. Additional open loop voltage gain is provided by feedback resistor 24. The voltage across resistor 24 is buffered by the emitter follower amplifier consisting of transistor 26 and resistor 28 which produces a low impedance output at the emitter of transistor 26.

The voltage at the emitter of transistor 26 is equal to the photosignal current of the photodiode 16 times the feedback resistor 30 plus the gate to source voltage, $V_{GS}$, of the GaAs input device 18. This undesirable contribution of $V_{GS}$ to the output voltage must be cancelled. A current compensation scheme is used to cancel out the effects of the absolute value of $V_{GS}$ as well as the effects of the thermally dependent value of $V_{GS}$. Before a compensating current can be added, the output voltage of the first transimpedance amplifier is transformed into a current by current setting resistor 40. Thus, the current flowing through current setting resistor includes a current portion due to the photosignal current of photodiode 16, as well as a portion due to $V_{GS}$ divided by the feedback resistor 30.

The current compensation circuit 25 consists of a variable current source 36, silicon diode 34, and resistors 32 and 38, in conjunction with current setting resistor 40 and a second, current summing, transimpedance amplifier 42. Ideally, the undesirable contribution to the current flowing in resistor 40 due to $V_{GS}$ should be zero. Therefore two currents are provided in a current compensation scheme to eliminate this contribution. A variable current source 36 compensates the current contribution of the absolute value of $V_{GS}$ and is summed with the signal current flowing in current setting resistor 40. The value of variable current source 36 is simply adjusted until the contribution of the absolute value of $V_{GS}$ is zero. Once this has been accomplished, the thermally dependent current due to $V_{GS}$ is minimized with a thermal current generator 35 consisting of silicon diode 34, resistor 32, and thermal setting resistor 38.

The following equations and assumptions are useful for determining the values of the current setting resistor 40 and the thermal setting resistor 38 in order that the unwanted thermal current contribution is minimized.

Assume: $R_{32} < R_{38}$ $R_{40} = R1$ $R_{38} = R2$ $V_E(Q26) = V(T)$ $V(D34) = VD(T)$ $I(R_{40}) = I1(T)$ and $I(R_{38}) = I2(T)$, where $T$ signifies a function of temperature.

For the thermal current contribution to be zero, the following condition must be satisfied:

$$VD(T) - I2(T)R2 = V_{CONSTANT} \qquad (1)$$

Therefore, $$\frac{dVD(T)}{dT} - R2\frac{dI2(T)}{dT} = 0 \qquad (2)$$

$$\frac{dI2(T)}{dT} = \frac{1}{R2}\frac{dVD(T)}{dT} \qquad (3)$$

Similarly,

-continued $$\frac{dV(T)}{dT} - R1\frac{dI1(T)}{dT} = 0 \quad (4)$$

$$\frac{dI1(T)}{dT} = \frac{1}{R1}\frac{dV(T)}{dT} \quad (5)$$

It is desired that, $$\frac{dI1(T)}{dT} = -\frac{dI2(T)}{dT} \quad (6)$$

Therefore, substituting (3) and (5) into (6), $$\frac{R1}{R2}\frac{dVD(T)}{dT} = -\frac{dV(T)}{dT} \quad (7)$$

To minimize the thermal current contribution of $V_{GS}$, it has been shown that the negative of the thermal gradient of silicon diode 34 must be set to the thermal gradient of the gate to source voltage of GaAs device 18, measured at the emitter of transistor 26, times the ratio of resistor R1 ($R_{40}$) divided by resistor R2 ($R_{38}$). The current contributions of the first transimpedance amplifier 15 and the compensation current generator 25 are summed by the second transimpedance amplifier 42 and a voltage output is provided at terminal 44 which is proportional only to the photosignal current of photodiode 16.

Typical values of the components of the SOLE FIGURE include 8.6 volts for V+, −8.6 volts for V−, 4.3 volts for $V_{REF2}$, −2.5 volts for $V_{REF3}$, 4.7K ohms for $R_{24}$, 1K ohms for $R_{28}$, and 1K ohms for $R_{40}$. Feedback resistor 30 may be comprised of several parallel resistors which are selectively switched for alternative gain modes. The value of $R_{38}$ and $R_{40}$ may be selected in accordance with the equations provided, in order that undesirable temperature effects are minimized. Other components may be of any suitable commercial type. As in any high speed circuit, care must be taken that the power supplies are decoupled to prevent oscillations and improve high frequency performance.

It will be appreciated that the present invention is not restricted to the particular embodiment that has been described, and that variations may be made therein without departing from the scope of the invention as defined in the appended claims and equivalents thereof.

I claim:

1. A thermally stabilized optical preamplifier comprising:
   (a) means for producing a photosignal current in response to an external light source;
   (b) a first transimpedance amplifier including an input GaAs device coupled to the producing means, the first transimpedance amplifier having a voltage output, the voltage output being the sum of the bias voltage of the GaAs device and a voltage proportional to the photosignal current;
   (c) means for converting the voltage output of the first transimpedance amplifier to a signal current;
   (d) a second transimpedance amplifier having a voltage output and a current summing input for receiving the signal current; and
   (e) means for providing a compensation current to the current summing input of the second transimpedance amplifier, the compensation current substantially cancelling the portion of the signal current produced by the bias voltage of the GaAs device.

2. A thermally stabilized optical preamplifier as in claim 1 wherein the first transimpedance amplifier comprises:
   a GaAs device having a drain, a source, and a gate, the gate forming the current input, the drain being coupled to a constant current source, and the source being coupled to AC ground;
   a common base gain stage having an input and an output, the input being coupled to the drain of the GaAs device and the output providing the voltage output; and
   a feedback resistor coupled between the gate of the GaAs device and the output of the common base gain stage.

3. A thermally stabilized optical preamplifier as in claim 1 wherein the means for providing a compensation current comprises a thermal current generator having a current output and a variable current generator having a current output, the current outputs being coupled together to produce the compensation current.

4. A thermally stabilized optical preamplifier as in claim 3 wherein the thermal current generator comprises:
   a silicon junction voltage generator having a voltage output; and
   a thermal setting resistor coupled between the output of the silicon junction voltage generator and the current summing input of the second transimpedance amplifier.

5. A thermally stabilized optical preamplifier as in claim 4 wherein the value of the current setting resistor is R1, the value of the thermal setting resistor is R2, the derivative of the voltage output of the silicon junction voltage generator is K1, the derivative of the bias voltage of the GaAs device is K2, and R1 and R2 are selected such that R1K1 = −R2K2.

* * * * *